United States Patent [19]

Bitaillou et al.

[11] Patent Number: 4,830,264

[45] Date of Patent: May 16, 1989

[54] METHOD OF FORMING SOLDER TERMINALS FOR A PINLESS CERAMIC MODULE

[75] Inventors: Alexis Bitaillou, Bretigny sur Orge; Michel Grandguillot, Verrieres le Buisson, both of France

[73] Assignee: International Business Machines Corporation, Armonk, N.Y.

[21] Appl. No.: 106,094

[22] Filed: Oct. 7, 1987

[30] Foreign Application Priority Data

Oct. 8, 1986 [EP] European Pat. Off. ......... 86430037.1

[51] Int. Cl.⁴ .............................................. B23K 31/00
[52] U.S. Cl. .................... 228/180.2; 228/207; 228/223; 228/245
[58] Field of Search ............... 228/180.2, 180.1, 207, 228/246, 258, 214, 223, 224, 245, 246

[56] References Cited

U.S. PATENT DOCUMENTS

| | | | |
|---|---|---|---|
| 3,871,015 | 3/1975 | Lin et al. | 228/180.2 |
| 4,332,341 | 6/1982 | Minetti | 228/180.2 |
| 4,412,642 | 11/1983 | Fisher, Jr. | 228/180.2 |
| 4,462,534 | 7/1984 | Bitaillou et al. | 228/180 A |
| 4,708,281 | 11/1987 | Nelson et al. | 228/223 |

OTHER PUBLICATIONS

E. Stephans, IBM Technical Disclosure Bulletin, vol. 20, No. 10, Mar. 1978, p. 3872, "Pinless Module Connector".
A. Bitaillou et al., "IBM Technical Disclosure Bulletin, vol. 27, for Untinned Substrate Process".

*Primary Examiner*—Nicholas P. Godici
*Assistant Examiner*—Karen Skillman
*Attorney, Agent, or Firm*—Steven J. Meyers; Yen S. Yee

[57] ABSTRACT

Disclosed is a method of forming solder terminals for a pinless module, preferably for a pinless metallized ceramic module. The method is comprised of the following steps: forming a substrate having a pattern of conductors formed onto its top surface and preformed via-holes extending from the top to bottom surface; applying a droplet of flux at at least one of said preformed via-hole openings of the bottom surface of said substrate to fill said via-holes with flux by capillarity and form a glob of flux at the bottom openings; applying a solder preform, i.e. solder balls on each glob of flux to which it will adhere, the volume of the preform being substantially equal to the inner volume of the via hole plus the volume of the bump to be formed; heating to cause solder reflow of the solder preform to fill the via-hole and the inner volume of the eyelet with solder; and, cooling below the melting point of the solder so that the molten solder solidifies to form solder terminals at the via-hole locations while forming solder columns in the via-holes. The resultant pinless metallized ceramic module has connections between the I/O's of the module interfacing with the next level of packaging, (i.e., printed circuit boards), that consist of integral solder terminals. Each integral solder terminal comprises a column in the vias of the metallized ceramic substrate, a mound of solder at the top surface of the substrate and spherical solder bumps on the bottom level for making interconnections with the next level of packaging.

16 Claims, 1 Drawing Sheet

METHOD OF FORMING SOLDER TERMINALS FOR A PINLESS CERAMIC MODULE

TECHNICAL FIELD

The present invention relates to the solder bonding of electronic modules to metallized bodies and more particularly to a method of forming solder terminals for pinless semiconductor packages having through-holes from the top to bottom surfaces such as metallized ceramic (MC) modules having solder bumps appropriate for direct and easy surface mounting onto metallized bodies such as printed circuit boards (PCB's) or printed wiring boards (PWB's).

BACKGROUND OF THE INVENTION

A basic metallized ceramic (MC) substrate process known in the art begins with a ceramic square, on the top surface of which, metallurgical strata of chromium for adhesion, copper for conduction, and chromium for a solder flow barrier, are deposited. A pattern of conductors is defined in the strata by a photolithographic process using standard photoresist techniques and sequential etching methods. The pattern forms wiring that will subsequently connect semiconductor chip input-/output (I/O) solder bumps to the I/O pins attached to the MC substrate. The pins provide electrical and mechanical connections with the outside world. The pins are typically inserted through preformed via-holes in the substrate and are mechanically swaged in place to form a bulge. Preformed via-holes are disposed in an array which may have various patterns. The ends of the conductors at those points where pins are provided take the form of eyelets. The heads of connecting pins previously inserted in the substrate are bonded to the eyelets of conductors formed on the top surface simultaneously with the bonding of the semiconductor chip to the conductors.

The preferred method of bonding the head of connecting pins comprises the steps of: applying a droplet of flux to the head of the pin, then applying a solder ball to the head where it is held in position because of the adhesive capacity of the flux, heating in a furnace containing a nitrogen atmosphere to cause a solder reflow and cooling to enable the solder to solidify. The method is described in detail in U.S. Pat. No. 4,462,534 entitled, "Method of Bonding Connecting Pins to the Eyelets of Conductors Formed on a Ceramic Substrate", by A. Bitaillou et al and assigned to the same assignee of the present invention.

The chips are attached to the substrate using the "Controlled Collapse Chip Connection" (C-4) process developed for tin-lead interconnections, also known under the generic name of "Flip Chip" technique. A polyimide coating is applied to the top surface, an aluminum cap is placed over the assembly, and an epoxy sealant is dispensed on the underside as a liquid and cured to provide a "quasi-hermetic" seal. After it has been marked and tested, the completed module is then ready for attachment to the appropriate second level package, such as a PCB.

Metallized ceramic (MC) technology as described above is a simplified version of the well known multilayer ceramic (MLC) technology. Compared to the MLC technology which appears to be only appropriate for use in medium and high performance computers, the MC technology aims preferably at more specific applications such as various peripherals, including banking machines, personal computers, etc. where low cost and simplicity are a required.

One of the problems associated with MC technology is related to the use of the aforementioned pins. These pins are elongated in shape and require perforated PCB's, i.e., PCB's provided with plated via-holes to receive the pins before bonding. Their handling, and automatic insertion into the plated via-holes still remain a problem and are a serious detractor from manufacturing yields.

In addition, perforated PCB's are costly and much space is lost due to the presence of the plated via-holes to receive the corresponding pins. Generally, the diameter of the elongated pins before tinning is about 0.6 mm, while the plated via-holes in the PCB have a diameter of about 1 mm. Due to the internal construction of the PCB, it is almost impossible to reduce the standard center to center distance of 2.54 mm. Should the use of pins be avoided, perforated PCB's would no longer be necessary and increased density could be reached because the center to center distance could be reduced to less than 1.27 mm., therefore considerably increasing the number of I/O's permitted on the same surface of the PCB. Furthermore, as the number of pins increases, the operation of inserting the module into the PCB becomes more difficult, and the likelihood of having pins bent during this step increases too. Moreover, when pins are used as I/O's, the module comes into close contact with the PCB leaving no clearance between them, unless costly stand-offs are provided to the pins. As a result, the cooling of the module is made more difficult. Another problem is that the use of modules having pins as I/O's in combination with perforated PCB's prevents bonding of MC modules on both sides of the PCB's. Still, another problem raised by the use of such a great number of pins is the difficulty of reworking the module to make engineering changes.

Today's packaging techniques are evolving towards the extensive usage of surface mount techniques (SMT) in order to improve the density of circuits at the card level and reduce packaging costs. According to SMT technology, perforated PCB's are no longer used and the terminals of modules are directly bonded to the desired metal lands of the PCB.

Commonly used surface mount modules such as those mentioned above are provided with peripheral I/O's. In this case the I/O's consist of metal leads bent under the bottom surface of the module that come into contact with the metal lands formed at the surface of the PCB. The cost of these modules becomes rapidly prohibitive when the number of I/O's increases to a high count (typically: 100 to 300) because of the amount of area required. For example, for a given technology, doubling the number of pins leads to a four-fold increase in module area with a similar loss of card area, and a degradation of the module electrical characteristics (inductances, resistances) which in turn, results in parasitic effects.

On the contrary, a module with I/O's placed on a grid pattern would be more efficient in terms of handling large numbers of I/O's. For example, an increase of I/O count by a factor of two, will result in a more reasonable factor of two for the module area. The system designer would then be able to take full advantage of the card density and optimization, and thus cost as well as the resulting electrical performance would be significantly improved. As a matter of fact, a pinless module having I/O'placed according to a grid pattern at the center of the bottom surface (opposite to said top surface) of the substrate or even occupying the whole bottom surface, would be a highly desirable solution in all respects.

An attempt to provide a pinless MC module is described in the IBM Technical Disclosure Bulletin, Vol. 20, No. 10, March 1978, page 3872, in an article entitled, "Pinless Module Connector" by E. Stephans. An electronic package is shown which includes a printed-circuit card, a metallized ceramic (MC) substrate, and an integrated circuit chip attached thereon. In this package, the integrated circuit chip is connected to the MC substrate by small solder joints in a standard way. The solder joints are usually spherical and have a diameter in the order of 0.1 mm. Unlike the conventional connection between the MC substrate and the PCB by elongated pins, the MC substrate is connected to the PCB by copper balls. These balls are approximately 1.5 mm in diameter. The package can be fabricated by attaching the copper balls to the MC substrate with conductive epoxy which fills the preformed via holes of the MC substrate. After the copper balls are attached to the MC substrate, the latter is placed on the PCB. The copper balls are then surface soldered to the metal lands formed on the top surface of the PCB.

The described solution, although resulting in a pinless MC module appears to present some drawbacks and insufficiencies. The technique of filling the preformed via-holes of the MC substrate is not detailed. Moreover, conductive epoxy is known to be a relatively high resistive material, therefore, the quality of the electrical connection between the conductive epoxy and the metallization pattern formed onto the top surface of the MC substrate is questionable.

In addition, the sticking of the copper balls to the conductive epoxy raises some unsolved problems, in particular the alignment of the ball with the via-hole and the reliability of the composite bond between the epoxy and the ball is not assessed. Furthermore, the possibility of reducing the copper ball size is questionable. The behavior of this composite bond during thermal stresses caused by the different expansion coefficients between the MC substrate and the PCB, has not been addressed either.

Therefore, there still exists a need for a method of forming pinless MC modules having I/O's on the bottom surface which obviates all of the problems cited above.

SUMMARY OF THE INVENTION

The foregoing problems are solved by the present invention using the method as defined below. As a consequence, pins are no longer used as I/O's but are replaced by solder terminals. According to the invention, such a solder terminal is comprised of three parts: a solder column which fills the via-hole, a solder mound at the top surface which makes an electrical connection with the corresponding eyelet, a bump-shaped protuberance at the bottom surface to be used for interconnection with metal lands of the PCB. All parts are integral and formed simultaneously. According to the particular embodiment, a method is, described for forming solder terminals for a pinless module, i.e., metallized ceramic (MC) module as described above, having solder bumps appropriate for surface mounting techniques to be bonded onto printed circuit boards (PCB's) and cards. The method is preferably comprised of the following steps:

(a) forming a metallized ceramic substrate having a pattern of conductors formed onto its top surface and an array of preformed via-holes, said conductors being terminated by eyelets at the location of said via-holes;

(b) applying where desired a droplet of flux at each preformed via-hole opening of the bottom surface of the substrate to fill the via-holes by capillarity and forming a glob of flux at each opening;

(c) applying a solder preform on each glob of flux to which it will adhere because of the adhesive property of the flux, the volume of the preform being substantially equal to the inner volume of the via hole plus the volume of the solder bump to be formed;

(d) heating to cause solder reflow of the solder preform to fill the via-hole and the inner volume of the eyelet with solder; and, (e) cooling below the melting point of the solder so that the molten solder solidifies to form solder terminals at each via-hole location while simultaneously forming a solder column in the via-hole, and a solder mound at the top surface of the substrate which makes electrical connections with the solder bumps at the bottom surface of the substrate.

A primary advantage of the present invention is that pinless (or leadless) electronic modules are easily produced. Typically, MC modules are produced wherein all of the problems related to pin handling and pin inserting, in addition to the use of perforated PCB's are alleviated; allowing such pinless electronic modules to fully comply with SMT requirements.

Another advantage of the present invention is to provide solder terminals to pinless substrates eliminating the conventional steps of pin inserting and swagging.

Another advantage of the present invention is to provide solder terminals to pinless substrates terminated with solder bumps formed on its bottom surface, therefore permitting easy repair and rework.

Another advantage of the present invention is to provide solder terminals for substrates terminated with solder bumps to be bonded to the corresponding metalization lands of a PCB by forming solid solder joints.

Another advantage of the present invention is to provide solder terminals to substrates terminated with solder bumps formed on its bottom surface according to a very dense grid pattern, either at the center of said bottom surface of the substrate or on the whole surface of it.

Another advantage of the present invention is to provide solder terminals to substrates terminated with solder mounds to make electrical connection with the eyelets of the conductors formed onto the top surface of the substrate.

Yet another advantage of the present invention is its tolerance to absorb thermal stresses caused by the unusual height of the solder terminal which is very important in this case (equal to the diameter of the solder bump plus the height of the solder column, i.e., thickness of the ceramic substrate).

Yet another advantage of the present invention is to provide solder joints between the MC substrate and the metallization lands of a PCB having non-negligible height to improve the cooling of the MC module.

A further advantage of the present invention is its flexibility in the tight control of the dimensions and the nature of the solder bumps, by using solder balls of different volumes and compositions.

A still further advantage of the present invention is its ability to be easily installed in any manufacturing line, and to produce reliable products with high throughputs.

These and other advantage of the present invention will appear more fully upon consideration of the various illustrative embodiments, to be now described in detail in connection with the accompanying drawings.

DETAILED DESCRIPTION OF THE PREFERRED EMBODIMENTS

Figure 1:
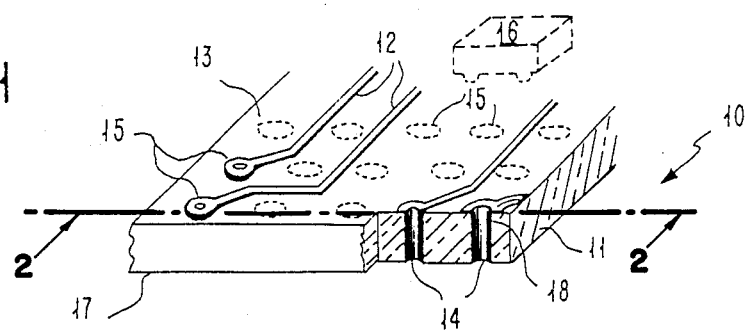
FIG. 1 is a schematic perspective view of a portion of an MC module, the cap of which has been removed, and shows the ceramic substrate with its pattern of conductors thereon, just before the conventional pinning step.

FIG. 1 illustrates a partially exploded view of a portion of a typical metallized ceramic (i.e., MC) module 10 of the prior art. The concepts of the present invention may be applied to this pinless MC module. The concepts and processes disclosed and claimed herein are not limited to such MC modules however. The module 10 can be of any suitable size to accommodate the desired number of chips or I/O's, e.g., 36×36 mm., thickness about 1 mm. The module preferably comprises a ceramic substrate 11 provided with a pattern of metal conductors 12 on its top surface 13. One end of each conductor 12 corresponds to a via-hole 14 (into which an elongated pin would be inserted according to the standard process), is enlarged and forms an eyelet 15. Each conductor varies in cross section to form finger-like structures (not shown). The finger-like structures are disposed according to a first array, adapted to be joined to a corresponding array of solder bumps of a semiconductor chip 16. Similarly, the via-holes 14 are disposed according to a second array. It will be appreciated that various arrays or geometric configurations can be implemented.

The bottom surface 17 may also be provided with a metallization pattern. The material, (e.g., ceramic) of the substrate 11 is preferably chosen for good mechanical, electrical and thermal properties so that the thermal expansion is a reasonably close match to the silicon material of the chips to be mounted on the top surface of the substrate.

As shown in FIG. 1, during the formation of the pattern of metal conductors on the top surface 13, the totality of the sidewalls of the via-holes 14 may also be metallized by a composite chromium-copper layer so that the eyelet 15 is a rivet-like structure with an annular copper ring 18 formed inside the via-hole. Complete metallization of the via-hole sidewalls is obtained only if a thin ceramic substrate 11 is used (thickness of about 1 mm. or less). Then, the above-mentioned metal ring is sufficient to make the inner walls of the via-hole wettable by the solder to be subsequently applied. If a thicker ceramic substrate (i.e., 1.5 mm. or greater) is used, it would then be necessary to provide complementary plating of the inner walls. The technique described in U.S. Pat. No. 4,024,629 "Fabrication Techniques for MLC Modules", issued to J. M. Lemoine et al and assigned to the present assignee, could be followed in that respect.

Figure 2:
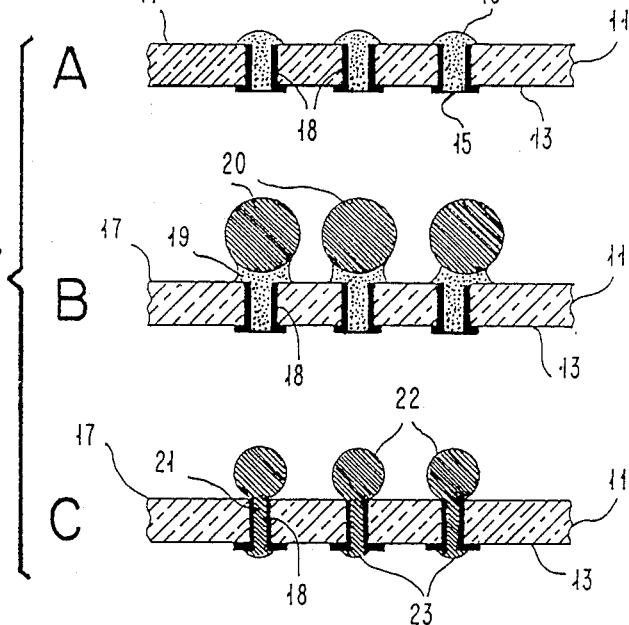
FIGS. 2A and 2C are cross sectional views of the ceramic substrate of FIG. 1 taken along line 2—2, during various steps of fabrication in accordance with a preferred embodiment of the method of the present invention.

The method of the present invention will now be described with reference to FIGS. 2A–2C. The technique described hereinafter is based partly on the teachings of above-mentioned U.S. Pat. No. 4,462,534. A minor improvement thereof has been published in the IBM Technical Disclosure Bulletin, Vol. 27, No. 10B, March 1985, pp. 6252–6253, in an article entitled, "Ball Placement Improvement for Untinned Substrate Process" by A. Bitaillou et al. Both disclosures are incorporated by reference herein, the main steps of which will be briefly summarized hereinafter. Only the significant differences between the method of the present invention and the prior art techniques will be detailed.

The first step of the process consists of dispensing flux, preferably, but not limited to, droplets, at the openings of the desired preformed viaholes. The flux dispensing device schematically shown in FIG. 2 of U.S. Pat. No. 4,462,534 is appropriate and a preferred means to use for reducing to practice the method of the present invention. According to the latter patent, a flux, such as Benzylic 102–1500 with a viscosity of about 200 poise is appropriate. The flux is contained in a Teflon tank housed in a stainless steel cylinder, the removable bottom of which, consisting of a wire cloth, forms a fluxing mask. The holes in the mask are arranged in a pattern corresponding to the array of via-holes. The flux is forced to flow through these holes during the dispense step. The pressure within the tank is established by a vacuum system controlled, for example, by a logic circuit or by the analog output from a processor. The substrate is positioned onto a support fitted with locating pins, it top surface 13 down and the bottom surface 17 is now turned upside. The flux remains in the tank while the latter is being positioned over the substrate and aligned therewith, and is then released by means of an air pulse supplied by the vacuum system.

Each opening of the via-holes of bottom surface 17 creates a sink which attracts the flux. FIG. 2A which is a cross-sectional view of the substrate shown in FIG. 1 along line 2—2, shows that each droplet of flux applied to the via-holes 14, fills completely the via-hole by gravity and capillaries, leaving a glob 19 of flux at the opening of the via-holes on the bottom surface 17 now turned upside.

It is to be noted that because the pins (typically approximately 0.6 mm. of diameter) are no longer used, the via-hole diameter may also be reduced, thus increasing the wiring density on both the top and bottom surfaces.

The next step preferably consists of the dispensing of solder preforms onto the globs of flux. Because solder balls are the preferred preforms, the other devices also described in U.S. Pat. No. 4,462,534 may also be used to cause solder balls to be dispensed and applied to any via-hole opening where desired. The solder balls adhere because of the adhesive capacity of the glob of flux deposited during the first step.

The solder balls selected for this application are approximately 0.7 to 1 mm. in diameter and the solder is preferably an alloy of Pb-Sn (90/10) having a melting point of approximately 280° C. In view of their light weight, the solder balls should be agitated before they are drawn by suction. To this end, the solder balls are initially placed in a bowl that is caused to vibrate using a vibrating device as shown in FIG. 4A of U.S. Pat. No. 4,462,534. The bowl should be made of an elastic material so as to allow the balls to bounce since vibrations alone proved insufficient to cause the solder balls to bounce in all cases. Polyethylene was found to be quite satisfactory for this purpose. The optimum number of solder balls to be placed in the bowl was determined to correspond to a single layer of solder balls at the bottom of the bowl when not vibrated. In the preferred embodiment, the bowl is a parallelepiped with a square base (70 mm.×70 mm.) and a height of 80 mm. The vibrating device comprises a plate resting on two oblique springs and an electromagnet which causes the plate to vibrate. Under the above conditions, the bouncing solder balls reach a height of about 20 mm. Other means could of course be employed for vibrating the solder balls, such as a container having a porous bottom for receiving compressed air.

FIG. 4B of U.S. Pat. No. 4,462,534 shows a suction device which sucks up the moving solder balls contained in the vibrating bowl and dispenses them to the previously fluxed substrate. The device comprises a soft iron frame which may be of circular shape and defines a suction chamber connected by a tube to a controlled vacuum system. An electromagnet surrounds the tube and is fed from a main supply (50 Hz) through a diode. The suction chamber is closed by a suction mask fitted with a rod, the far end of which is located within the air gap of the electromagnet. The mask consists of a perforated membrane 0.1 mm. in thickness that is made of an alloy of beryllium and copper. The holes in the membrane are 0.4 mm. in diameter and also correspond to the array of preformed via-holes of the substrate, preferably an MC substrate.

The operation of the devices shown in FIGS. 4A and 4B of U.S. Pat. No. 4,462,534 is summarized as follows. The device is first operated to cause the solder balls in the bowl to vibrate. The device previously connected to the vacuum source is then inserted into the vibrating bowl such that the distance between the suction mask and the bottom of the bowl is about 5 mm. The time necessary for all of the solder balls to be sucked up is about one second. The suction device, including the mask with which the solder balls are maintained in contact by the vacuum, is then removed from the bowl and positioned over the substrate so that the pattern of solder balls and the pattern of globs of flux are aligned, however, it does not matter if the patterns are slightly offset with respect to each other. It is just necessary to ensure that each ball lies over at least a portion of the corresponding glob of flux. The mask may be aligned through the use of locating pins provided on the support on which the electronic substrate rests and which fit into matching cavities in the frame of the device. The solder balls are thus brought into contact with the corresponding globs of flux. The vacuum system is then turned off, and the electromagnet is energized for about half a second to cause the membrane to vibrate. As a result, the solder balls separate more easily from the membrane while continuing to adhere to the via-hole openings because of the flux thereon.

FIG. 2B illustrates the configuration of the solder balls 20 on an MC substrate 11 and clearly shows that in some instances, a slight offset between the opening of the via-hole and the attached solder ball 20 may happen.

In the next preferred step, the substrate (e.g., metallized ceramic) is then introduced in a conventional furnace or oven, containing a reducing atmosphere such as nitrogen, to prevent oxidation and having a peak temperature in the range of about 200° C. to 350° C., and the time the solder is above its melting point is about 15-60 seconds, depending on the solder composition, to cause solder reflow, thereby filling the via-hole by capillary and gravity and leaving unexpectedly a bump of solder. Even if the solder ball is slightly offset with respect to the via-hole opening, the resulting solder bump is perfectly aligned with it. All solder bumps thus formed exhibit uniform geometries and volumes.

FIG. 2C illustrates the MC substrate before cooling, showing the resulting structure and the shape of the solder which fills the via-hole forms, solder bumps 22 at the openings of the bottom surface 17 now facing upwards, and mounds 23 wetting the inner walls of the eyelet. The volume of the solder balls 20 must take into account the combined volumes of the via-hole and of the solder bump.

The substrate is then allowed to cool below the melting point of the solder, whereby the molten solder will solidify to produce the final solder terminals comprised of three integral parts: a column, a bump and a mound of solidified solder.

Figure 3:
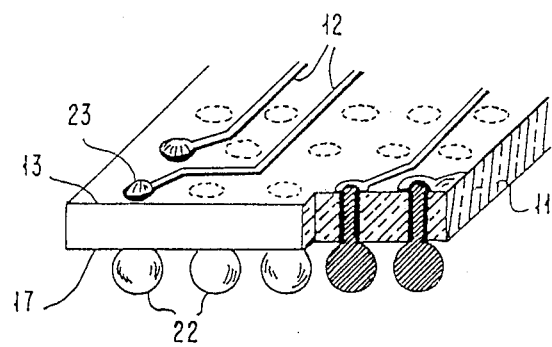
FIG. 3 is a schematic perspective view of the ceramic substrate of FIG. 1 after formation of solder terminals.

FIG. 3 shows the resulting structure after cooling, with its top surface 13 upside again. The solder bumps 22 are to be used as I/O's of the MC module. Solder mounds make the electrical connection between said bumps and the pattern of metal conductors.

The next step consists of cleaning the resulting substrate, for example, by dipping the substrate in a perchlorethylene bath, in order to degrease the substrate and eliminate flux residuals.

The bottom surface of the substrate may then be visually inspected to detect missing solder bumps. In this case, rework is very easy because it is sufficient to add flux at the missing location, place solder bumps and reflow again. Other solder bumps will not flow or spread due to the very high capillary forces.

The chip may be bonded to the MLC substrate either before the formation of solder bumps or simultaneously therewith. In the first case one may use different solder compositions. For example, silicon chip solder bumps may utilize 95/5 solder with a melting point of 320° C. and the solder terminals may utilize a 90/10 solder with a melting point of 280° C. The solder terminals may be completed before chip joining, although they have a lower melting temperature than the silicon chips solder bumps, because of the extreme strength of capillarity forces at the location of the via-holes. If the chips are to be joined simultaneously with the solder bumps, it suffices to dispense droplets of flux to be applied onto the contact fingers at the ends of the conductors so that they correspond to the solder bumps on the silicon chips, and by positioning the chips. Depending on the specific application, reflow temperatures, reflow times, relative volumes of solder, and solder compositions are parameters which are readily known by those skilled in the art.

The substrate is then processed according to the standard manufacturing steps: test, encapsulation, etc., to provide a completed pinless module appropriate for SMT.

Surface mounting of the pinless module on a printed circuit board (not shown) would typically comprise depositing solder paste (e.g., 60% Sn and 40% Pb) on predetermined contact zones of the PCB, aligning and contacting the solder bumps of the module with such zones and reflowing the 60/40 solder at 185° C. The PCB is preferably of the multilayer type and is provided with a corresponding grid of copper pads of a diameter of about 0.6 mm. The PCB is covered by a layer of a protective varnish excepted at the pad locations. Use of solder paste and protective varnish avoids misalignment problems. However, if any difficulty is raised, the use of a template to maintain the module where appropriate would overcome the problem. On the other hand, the technique described for the pre-tinning of the zones in the aforementioned Pottier reference may also be used.

As can be understood, a significant advantage of the method of the present invention from a manufacturing point of view is its simplicity. In addition, because a wide variety of preformed solder balls in both size and composition are available, another advantage is the flexibility of the above method, which is easily adapted to any kind of modules, application, etc. Also, the volume of the solder bumps to be used as I/O's is very accurate, because commercially available solder balls are available that have a very precise volume.

It is an important advantage of the present invention to provide a method of getting a controlled amount of solder at each bonding location. Depending on the volume of the solder ball, the shape and in particular the height of the solder bump may vary in some degree. This causes an important additional advantage related thereto because the volume of the solder ball determines the height of the solder joint formed between the MC module and the PCB obtained after cooling. It has generally the broad shape of a column or pillar, so that the gap between the bottom surface of the MC module and the top surface of the PCB is no longer negligible. As a consequence, this gap significantly contributes, not only to the air cooling of the module, but also to the reduction of thermal stresses due to differences in thermal dilation coefficients between the substrate and the PCB material. This reduction is very significant due to the presence of the solder column.

Replacing of pins to be inserted in the holes of a perforated PCB by solder bumps results in a significant increase in the ability of repair or rework the MLC module. In particular, as explained above, it is easy to rework the MC substrate if visual inspection has revealed a missing solder bump.

It is a significant additional advantage of the present invention to allow the formation of solder bumps at the center of an MC module according to a denser grid pattern therefore resulting in a significant increase of I/O's integration. It must be observed that the method of the present invention allows the whole bottom surface of the MC substrate to be used if desired and not only the periphery of the substrate as in known techniques.

It is an additional significant advantage of the method of the present invention to provide a solder terminal which makes, simultaneously with the formation of solder bumps to be used as I/O's, the electrical connection with the eyelets of the pattern of metal conductors formed on the top surface of the ceramic substrate.

The method of this invention is also applicable to MC substrates having a pattern of metal conductors on both sides. It can provide solder bumps at the two ends of the via-holes.

While this invention has been particularly described with reference to the preferred embodiments thereof, it will be understood by those skilled in the art that the foregoing and other changes in form and details may be made therein without departing from the spirit and scope of this invention.

We claim:

1. A method of forming solder terminals for a pinless module having solder bumps to be bonded onto printed circuit boards comprising the steps of:
    forming a substrate having a pattern of conductors formed onto its top surface and preformed via-holes extending from the top to bottom surface;
    applying a droplet of flux at at least one of said preformed via-hole openings of the bottom surface of said substrate to fill said via-holes with flux by capillarity and form a glob of flux at the bottom openings;
    applying a solder preform on each glob of flux to which it will adhere, the volume of each preform being substantially equal to the inner volume of the via hole plus the volume of the bump to be formed;
    heating to cause solder reflow of the solder preform to fill the via-hole and the inner volume of the eyelet with solder; and,
    cooling below the melting point of the solder so that the molten solder solidifies to form solder terminals at the via-hole locations while forming solder columns in the via-holes.

2. The method of claim 1 further comprising the step of metallizing the sidewalls of said via-holes prior to applying said flux.

3. The method of claim 1 wherein said preformed via-holes are at the center of the said substrate.

4. The method of claim 2 wherein said preformed via-holes are at the center of the said substrate.

5. The method of claim 1 wherein said solder preforms are solder balls.

6. The method of claim 2 wherein said solder preforms are solder balls.

7. The method of claim 5 further comprising the step of turning said substrate upside down to have its bottom surface facing up prior to applying said flux.

8. The method of claim 6 further comprising the step of turning said substrate upside down to have its bottom surface facing up prior to applying said flux.

9. The method of claim 1 further comprising the step of joining silicon chips having solder bumps to the pattern of conductors formed atop said substrate.

10. The method of claim 2 further comprising the step of joining silicon chips having solder bumps to the pattern of conductors formed atop said substrate.

11. The method of claim 5 further comprising the step of joining silicon chips having solder bumps to the pattern of conductors formed atop said substrate.

12. The method of claim 6 further comprising the step of joining silicon chips having solder bumps to the pattern of conductors formed atop said substrate.

13. The method of claim 9 wherein said silicon chips having solder bumps are joined to the pattern of conductors formed atop said substrate during said heating step to cause solder reflow to fill the via holes and the inner volume of the eyelets with solder.

14. The method of claim 10 wherein said silicon chips having solder bumps are joined to the pattern of conductors formed atop said substrate during said heating step to cause solder reflow to fill the via holes and the inner volume of the eyelets with solder.

15. The method of claim 11 wherein said silicon chips having solder bumps are joined to the pattern of conductors formed atop said substrate during said heating step to cause solder reflow to fill the via holes and the inner volume of the eyelets with solder.

16. The method of claim 12 wherein said silicon chips having solder bumps are joined to the pattern of conductors formed atop said substrate during said heating step to cause solder reflow to fill the via holes and the inner volume of the eyelets with solder.

* * * * *